United States Patent
Yu (10) Patent No.: US 10,085,365 B2
(45) Date of Patent: Sep. 25, 2018

(54) THERMAL CONDUCTING STRUCTURE APPLIED TO NETWORK CONTROL AUTOMATION SYSTEM

(71) Applicant: ADLINK TECHNOLOGY INC., New Taipei (TW)

(72) Inventor: Chia-Te Yu, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/604,099

(22) Filed: May 24, 2017

(65) Prior Publication Data

US 2017/0257983 A1    Sep. 7, 2017

Related U.S. Application Data

(63) Continuation of application No. 14/844,676, filed on Sep. 3, 2015.

(51) Int. Cl.
*H05K 7/20* (2006.01)

(52) U.S. Cl.
CPC ................ *H05K 7/20545* (2013.01)

(58) Field of Classification Search
CPC ........... H05K 7/20536; H05K 7/20418; H05K 7/20427; H05K 1/0209
USPC .................. 361/704, 719, 707, 777; 174/252
See application file for complete search history.

(56) References Cited

U.S. PATENT DOCUMENTS

| | | | |
|---|---|---|---|
| 5,428,806 A | 6/1995 | Pocrass | |
| 6,650,548 B1 | 11/2003 | Swetland | |
| 7,312,525 B2 | 12/2007 | Tatt et al. | |
| 9,572,245 B1* | 2/2017 | Yu | H05K 1/0209 |
| 2005/0259401 A1 | 11/2005 | Han et al. | |
| 2007/0261882 A1* | 11/2007 | Laio | H05K 1/0209 |
| | | | 174/252 |
| 2008/0055861 A1 | 3/2008 | Nagareda et al. | |
| 2010/0324730 A1 | 12/2010 | Muller | |
| 2014/0301069 A1 | 10/2014 | Hwu et al. | |
| 2014/0327607 A1 | 11/2014 | Chen | |

* cited by examiner

*Primary Examiner* — Mandeep S Buttar
(74) *Attorney, Agent, or Firm* — Muncy, Geissler, Olds & Lowe, P.C.

(57) ABSTRACT

A thermal conducting structure applied to a network control automation system includes a circuit module and a heat dissipation structure. Copper foil layers are horizontally disposed on bare copper regions disposed at top and bottom sides of circuit board. An outer shell member includes side panels disposed at top and bottom sides, and each side panel defines a track member comprising a sliding edge. The copper foil layers can be slidably mounted along sliding edges, and outer shell member is pushed to inwardly move relative to circuit board, then circuit board is positioned in accommodation open chamber formed between outer shell member and two side panels. While assembling, copper foil layers are abutted and mounted with sliding slots, forming thermal conducting path. Heat generated by heat source can be conducted to heat dissipation structure through two copper foil layers, to increase heat dissipation area and improve heat dissipation efficiency.

10 Claims, 8 Drawing Sheets

THERMAL CONDUCTING STRUCTURE APPLIED TO NETWORK CONTROL AUTOMATION SYSTEM

CROSS REFERENCE TO RELATED APPLICATIONS

This application is a Continuation of co-pending application Ser. No. 14/844,676, filed on Sep. 3, 2015, for which priority is claimed under 35 U.S.C. § 120, the entire contents of all of which are hereby incorporated by reference.

BACKGROUND OF THE INVENTION

1. Field of the Invention

The present disclosure relates to a thermal conducting structure applied to a network control automation system, more particularly to a thermal conducting structure capable of dissipating heat generated during operation of a heat source of a circuit module through copper foil layers located at two opposite side ends of the circuit board to sliding edges of track members at two side panels of an outer shell member of a heat dissipation structure. As a result, the thermal conducting structure can assist heat dissipation and increase entire heat dissipation area, thereby improving overall heat dissipation efficiency.

2. Description of the Related Art

With the rapid development of electronic technology, computers, laptops and other computer equipment are ubiquitous in every corner of society, and their development trend towards high computing power, fast speed and small size. However, with open framework of the computer equipment, standardization of software and hardware and continuous expansion and upgrading in functions, manufacturers start to develop industrial computers used in different professional fields including applications of industrial control, industrial automation, network and communication equipment, machine vision, intelligent transport system, and so on. Moreover, the industrial computers also can be used in military, transportation, aerospace field or other industrial applications which are required for high reliability and stability, thereby satisfying customer's requirements for particular specification and various high-efficiency operations in the severe environment.

Further, because the information industry progresses continually and network communication technology boosts, a new generation industrial automation equipment based on an instant communication interface develops quickly and vigorously. A servo control technology used by traditional automation equipment and machine platform has some problems, such as poor multi-shaft synchronous and instant performance, insufficient resolution, restriction due to numerous wires, noise interference, and so on. Therefore, serial servo control technologies which can utilize the instant communication system to transfer digital signals and control parameters via network media and be applied for various transfer communication protocols used by industrial automatic control systems, are provided in recent years. For example, the EtherCAT is a new open-ended technology, a fieldbus technology based on Ethernet network architecture, and also a distributed I/O system having high performance. The EtherCAT technology has advantages in easy wiring, cost saving, anti-interference and remote control, and also has potential in developing a motion control technology having higher speed and high precision, so that the EtherCAT and the motion control technology can be integrated as a distributed control servo drive system to replace a large single control system. However, because of development trend of the industrial automatic control system towards smaller size and higher speed, a temperature of the FPGA chip, the CPU, the chipset, the image processor or other heat source on a circuit board will also be greatly raised. Therefore, an important issue for stabilization of industrial automatic control system is how to ensure that the system can be operated normally at a permissive temperature and its overall heat dissipation efficiency can be improved. The important issue has been regarded as a problem to be solved effectively by people who engage in this industry.

SUMMARY OF THE INVENTION

The present invention has been accomplished under the circumstances in view. It is therefore the main object of the present invention to provide a thermal conducting structure including a circuit module and a heat dissipation structure. A circuit board of the circuit module has at least one heat source, and the circuit board defines bare copper regions disposed at top and bottom side ends thereof, and copper foil layers are disposed on the bare copper regions in a horizontal direction. The heat dissipation structure includes an outer shell member which has two side panels at top and bottom sides thereof, and each of the two side panels defines a track member having a sliding edge. An accommodation open chamber through front-to-rear is formed between the outer shell member and the two side panels. The two copper foil layers of the circuit board can be slidably mounted along the sliding edges of the track members of the outer shell member respectively, and the outer shell member is further pushed to move inwardly relative to the circuit board, so that the circuit board can be received and positioned in the accommodation open chamber. After assembly, the copper foil layers of the circuit board are abutted and mounted with the sliding slot formed inside the sliding edges to form thermal conducting path to conduct heat, heat generated by the heat source of the circuit board in operation can be conduct to the heat dissipation structure through the two copper foil layers of the circuit board, so that the entire heat dissipation area can be increased and the entire heat dissipation efficiency of the thermal conducting structure of the present disclosure can further be improved.

According to an aspect of the present disclosure, the circuit board of the circuit module has a plurality of fastening parts disposed thereon and around the heat source, and the fastening parts are combined with a heat conducting module which has a first contact plate and a second contact plate with smooth shape, and thermal mediums are further disposed on the first contact plate and the second contact plate for respectively elastically attaching to the heat source and an inner wall of the outer shell member of the heat dissipation structure to form thermal conducting path. During operation of the heat source of the circuit board, a portion of the heat generated by the heat source can be directly conducted to the outer shell member of the heat dissipation structure through the two copper foil layers of the circuit board, and the rest of the generated heat can be further conducted to the outer shell member through the heat conducting module to form thermal conducting path, whereby the heat conducting module cooperating with the heat dissipation structure can more efficiently increase entire heat dissipation area to improve the heat dissipation efficiency for the heat source and keep the system to operate normally.

According to other aspect of the present disclosure, while the copper foil layers of the circuit board of the circuit module is slidably mounted along the sliding edges of the outer shell member of the heat dissipation structure, the copper foil layers can be slid more smoothly because of self-lubrication of the copper material, so as to prevent the insulation coating layer coated on the circuit board from being scraped or damaged improperly, and the entire usage function and effect of the heat dissipation structure of the present disclosure can further be improved.

According to other aspect of the present disclosure, the outer shell member of the heat dissipation structure can be used to cover the heat source and other electronic components of the circuit board of the circuit module for protection, and further prevent the multiple sets of the circuit modules from being damaged or broken because of being impacted with each other. Therefore, the thermal conducting structure of the present disclosure can have nice practicability.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of embodiments. As used herein, the term "or" includes any and all combinations of one or more of the associated listed items.

Figure 1:
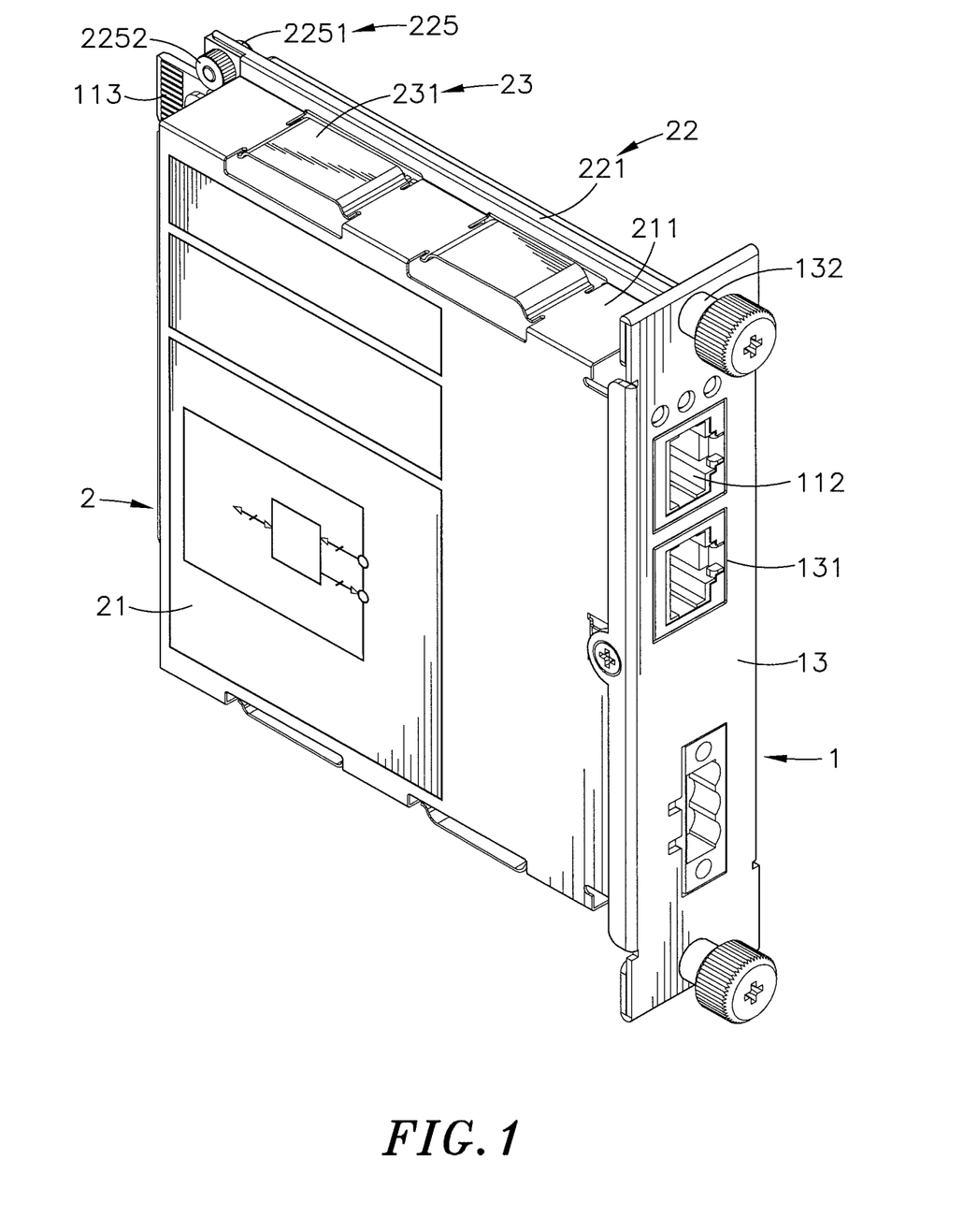
FIG. 1 is an elevational view of a thermal conducting structure of the present disclosure.
Figure 2:
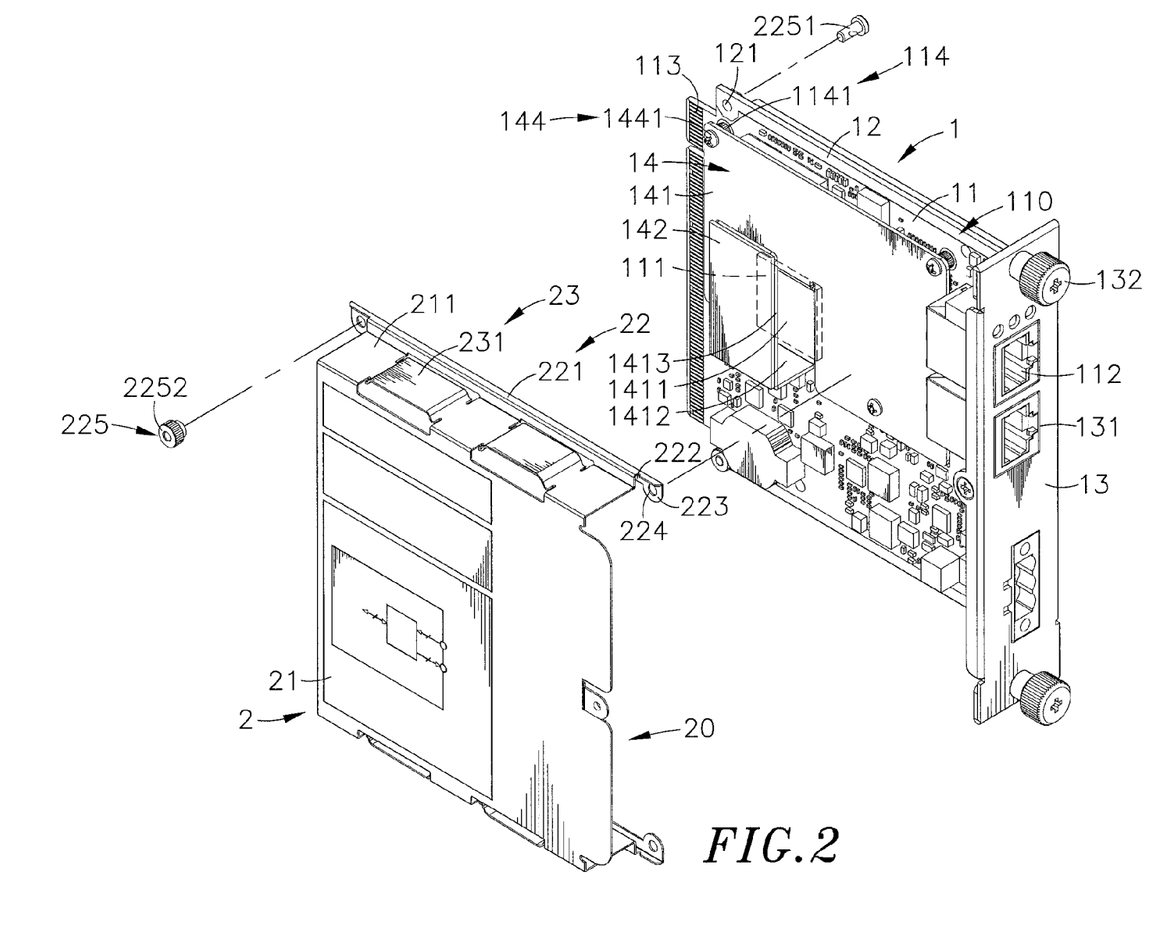
FIG. 2 is an exploded view of the thermal conducting structure of the present disclosure.
Figure 3:
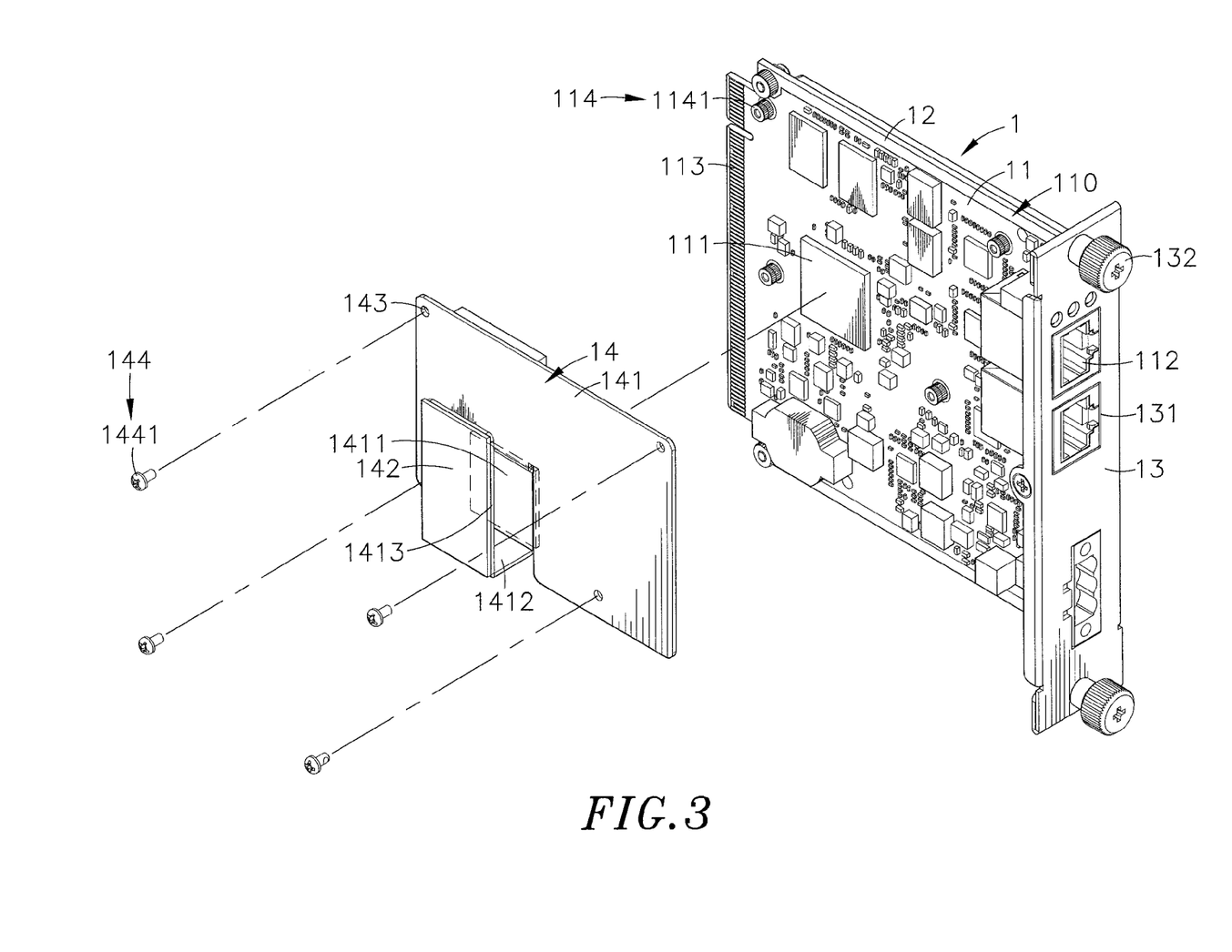
FIG. 3 is an exploded view of a circuit board and a heat conducting module of the circuit module of the present disclosure before assembly.

Please refer to FIGS. 1 through 3 which show elevational view and exploded view of the thermal conducting structure of the present disclosure, and an exploded view of a circuit board of a circuit module and a heat conducting module of the present disclosure before assembly. As shown in FIG. 1 through FIG. 3, the thermal conducting structure of the present disclosure includes a circuit module 1 and a heat dissipation structure 2. Main members and features of the present disclosure are described below.

The circuit module 1 includes a circuit board 11 disposed uprightly. In this embodiment, the circuit board 11 may be a multilayer circuit board, but in actual application, the circuit board 11 may be a single-sided circuit board or a double-sided circuit board; circuits and devices are disposed on the circuit board, and at least one ground layer made by metal is disposed inside or on the circuit board. At least one heat source 111 is disposed on a left side surface, a right side surface, or left and right side surfaces of the circuit board 11. Preferably, the heat source 111 can be a FPGA chip; alternatively, in actual applications, the heat source 111 can be a CPU, chip set (such as ICH, RAM and so on), or an image processor (such as GMCH). The circuit board 11 defines bare copper regions 110 at top and bottom side ends thereof, and is provided with copper foil layers 12 respectively disposed along a horizontal direction on the bare copper regions 110 of the top and bottom side ends of the circuit board 11. The copper foil layers 12 adsorbs heat through the circuit board 11 directly, or the copper foil layers 12 and the ground layer form a thermal conducting path to facilitate the heat generated during operation of the heat source 111 to be conducted to the copper foil layers 12 through the circuit board 11. The circuit board 11 further defines a plurality of mounting holes 121 cut through the copper foil layers 12 at corners thereof.

Further, the circuit board 11 has a plurality of ports 112 at a front part thereof. The port 112 can be a power connector, a network connector (such as RJ45) or other connector matching with other transmission interface specification. The circuit board 11 includes an insertion part 113 (such as a plurality of metal contacts) disposed along a vertical direction at a rear end thereof. The plurality of ports 112 and the insertion part 113 are electrically connected with the heat source 111 through circuits on the circuit board 11. Furthermore, a panel 13 disposed at the front part thereof, and the panel 13 defines a plurality of hollow parts 131 cut therethrough to expose the ports 112. The panel 13 includes two manual screws 132 disposed at top and bottom sides thereof, so that the heat source 111 of the circuit board 11 in cooperation with the plurality of port 112 and the insertion part 113 can be constructed as a network interface card or a serial transmission card matching with the Ethernet-network-based fieldbus technology or other communication protocol.

The circuit board 11 further has a plurality of fastening parts 114 located on a surface thereof and around the heat source 111. Each of the fastening parts 114 has a bolt 1141. The fastening parts 114 are used to combine with a heat conducting module 14 which has a smooth-shaped base plate 141. A side surface of the base plate 141 is bent towards the circuit board 11 and extended to final at least one a smooth-shaped first contact plate 1411 which is misaligned in parallel with the base plate 141 and configured to be directly abutted with and positioned on a surface of the heat source 111, and a lower end of the first contact plate 1411 is further bent outwardly to extend cross the base plate 141 to form a bent part 1412 at other side surface of the base plate 141, and the bent part 1412 is further bent and reversely extended in parallel with the first contact plate 1411 to form a smooth-shaped second contact plate 1413. In this embodiment, Thermal mediums 142 (such as elastic thermal pads, thermal paste, and so on) are respectively disposed on surfaces of the first contact plate 1411 and the second contact plate 1413 of the base plate 141, so that the first contact plate 1411 and the second contact plate 1413 can be elastically attached on the surface of the heat source 111. Furthermore, the heat conducting module 14 defines a plurality of first punches 143 cut therethrough corners of surface of the base plate 141 and corresponding in position to the fastening parts 114 of the circuit board 11, and positioning elements 144 having screws 1441 are respectively disposed in the first punches 143. Each of the screws 1441 is penetrated through the first punch 143 and then screwed into the bolts 1141 of the fastening parts 114, so as to combine the heat conducting module 14 and the circuit board 11 integrally.

The heat dissipation structure 2 includes an outer shell member 21 which defines two opposite side panels 211 at up and bottom sides thereof. Each of the side panels 211 defines a sliding edge 221 of a track member 22. Each sliding edge 221 is formed by being extended outwardly first and then bent inwardly. Each sliding edge 221 defines a sliding slot 222 extended along a horizontal direction therein. An accommodation open chamber 20 through front-to-rear is formed between the outer shell member 21 and the side panels 211. The sliding edge 221 further defines lugs 223 respectively located at front and rear openings of the sliding slots 222 and extended outwardly, and each lug 223 has a second punch 224. A nut 2252 is disposed in the second punch 224 and can be inserted by and locked with a screw 2251 of a fixing element 225. Alternatively, the nuts 2252 can be directly welded and fastened on the copper foil layers 12, and aligned with the mounting holes 121 at the corners of the circuit board 11, to facilitate the screws 2251 to be locked into the nut 2252 respectively. Each of the two side panels 211 of the outer shell member 21 further defines at least one elastic convex part 23 having a spring clip 231, and the spring clip 231 has an arch structure or a hanging-arm structure.

The heat conducting module 14 of the circuit module 1 can be made of aluminum material by utilizing process of mechanically punching press or bending. In a preferred implementation, the heat dissipation structure 2 is made of copper, iron or steel material integrally, and structures of the outer shell member 21 and the track members 22 thereof are shaped by process of mechanically punching press and bending. Alternatively, in actual application, the heat dissipation structure 2 can be made of aluminum material integrally, and the outer shell member 22 can be a frame panel, or the outer shell member 21 has a plurality of standing fins located on the surface thereof and formed by the aluminum extrusion process to increase surface areas for heat dissipation. There are various manners for shaping and forming the heat conducting module 14 and the outer shell member 21 of the heat dissipation structure 2, so their designs can be changed according to the actual application.

Figure 4:
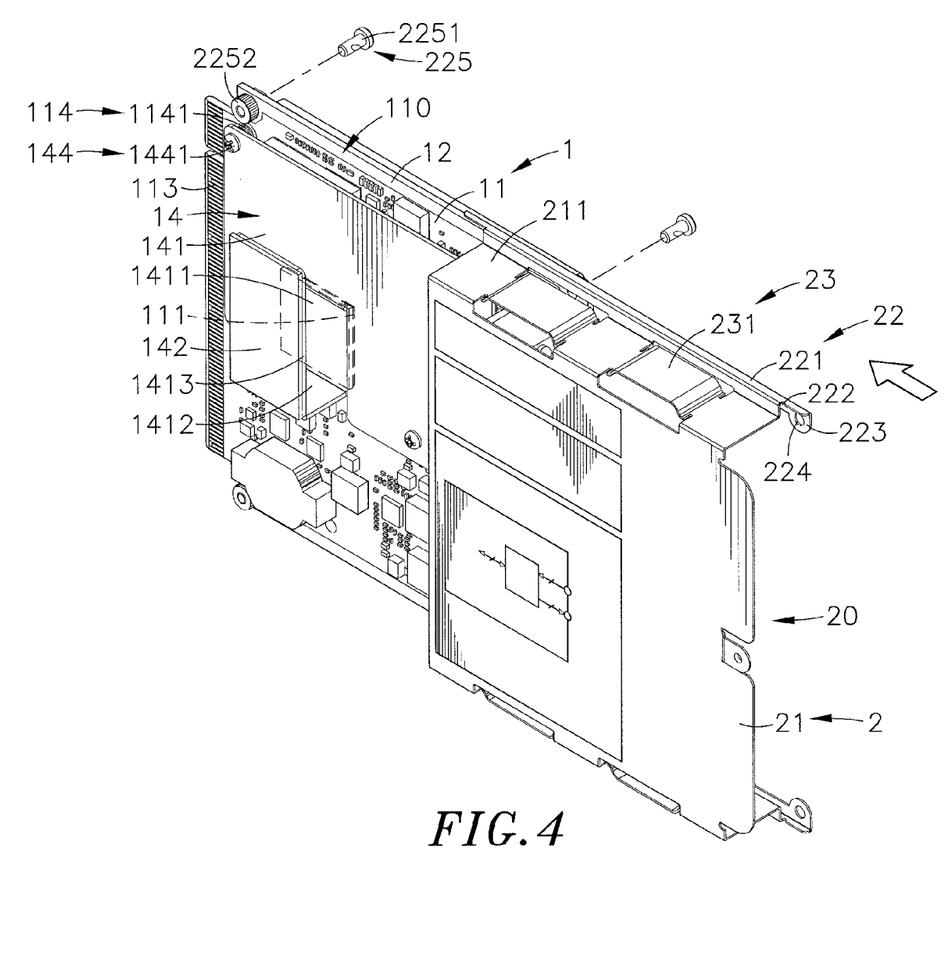
FIG. 4 is an elevational view of the circuit module and a heat dissipation structure of the present disclosure during assembly.
Figure 5:
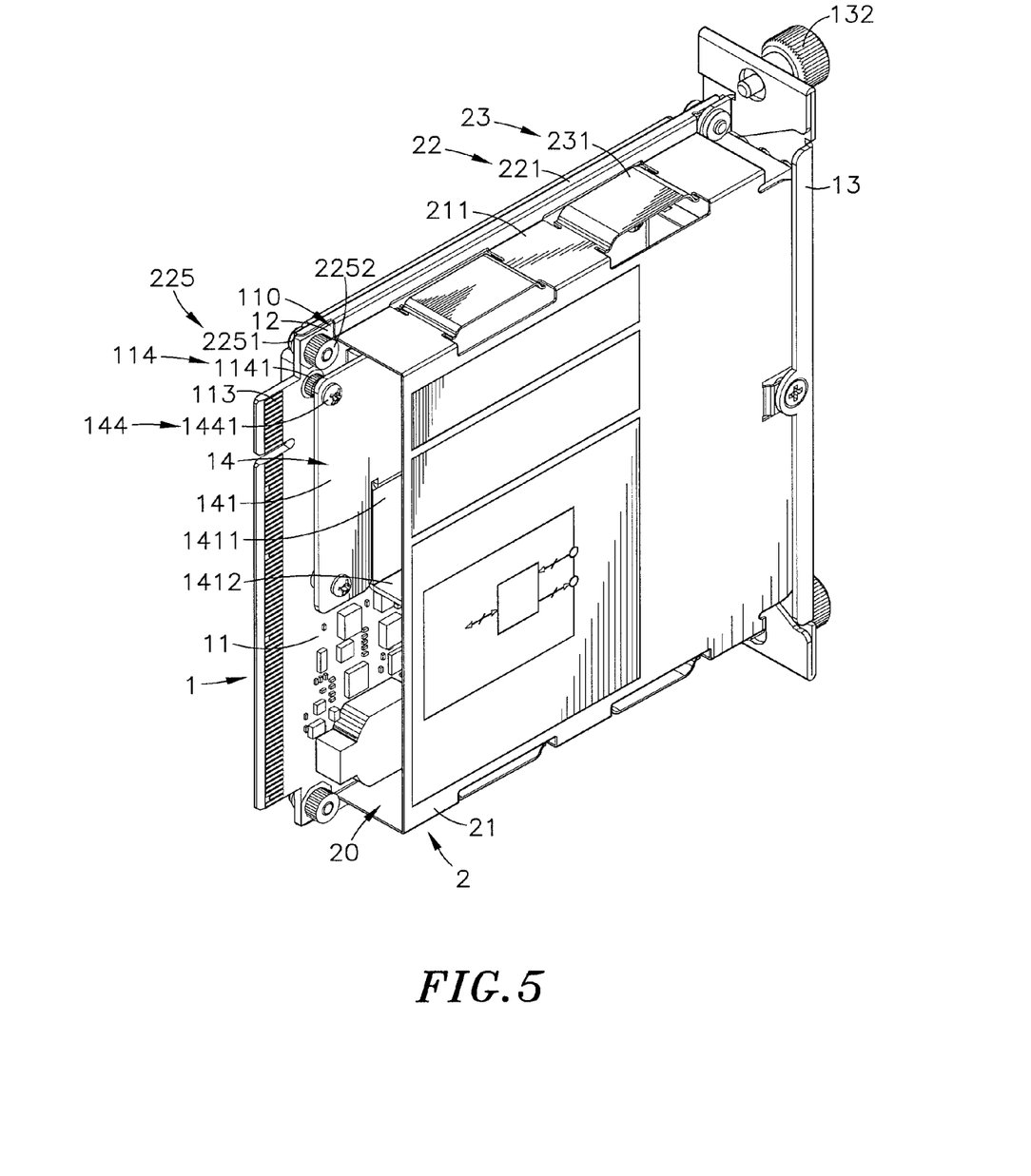
FIG. 5 is an elevational view of the circuit module and the heat dissipation structure of the present disclosure after assembly.
Figure 6:
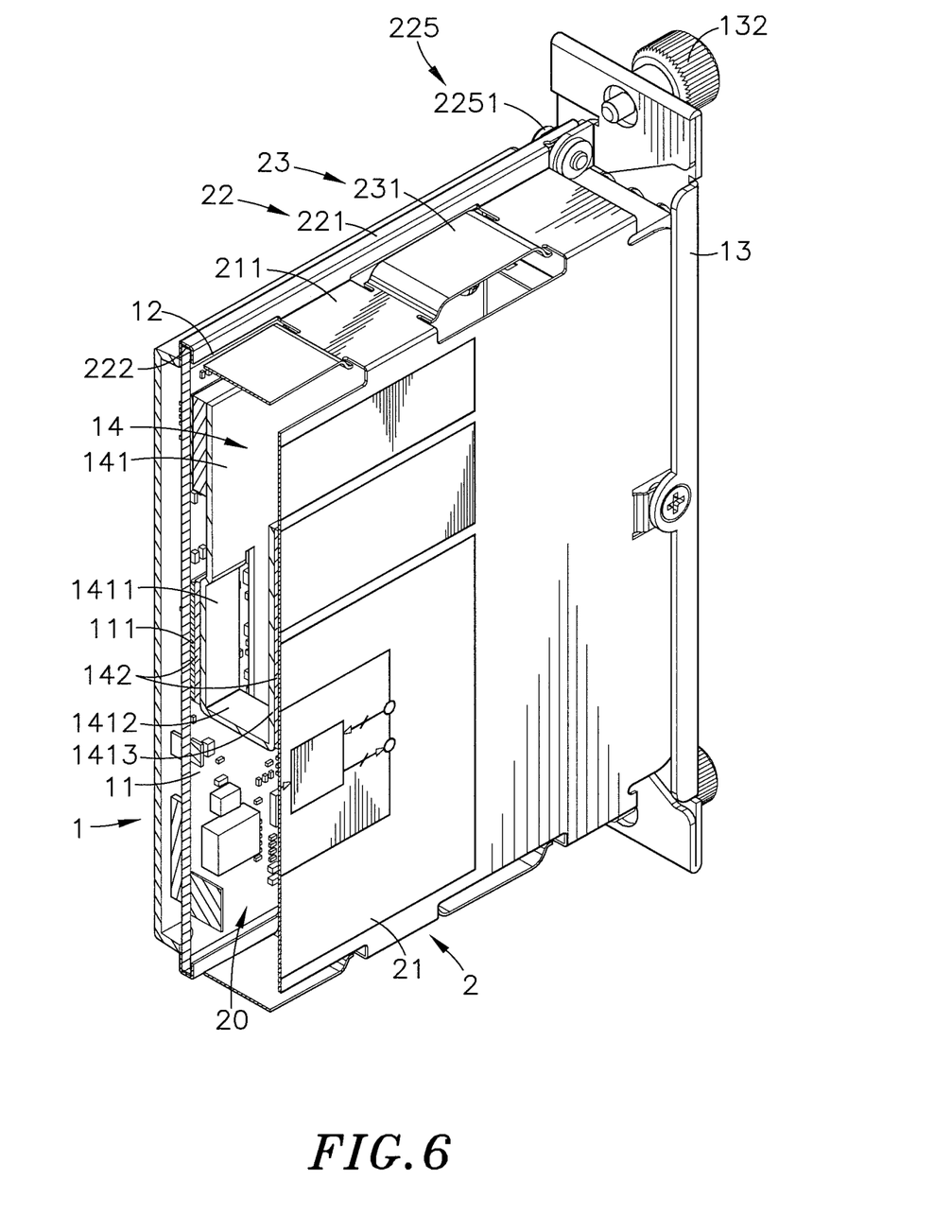
FIG. 6 is a sectional and elevational view of the circuit module and the heat dissipation structure of the present disclosure after assembly.

Please refer to FIGS. 4 through 6 which show elevational view of the circuit module and the heat dissipation structure during assembly, and elevational view and sectional view of the circuit module and the heat dissipation structure after assembly, respectively. As shown in FIG. 4 through FIG. 6, during assembly of the circuit module 1 and the heat dissipation structure 2 of the present disclosure, the sliding edges 221 of the track members 22 of top and bottom sides of the outer shell member 21 are used to respectively mount the copper foil layers 12 of the circuit board 11 corresponding thereto, and the copper foil layers 12 of the circuit board 11 are slidably mounted along the sliding slots 222 of the sliding edge 221, and the outer shell member 21 is then pushed to move inwardly relative to the circuit board 11, so as to receive and position the circuit board 11 in the accommodation open chamber 20. After the copper foil layers 12 of the circuit board 11 are mounted by sliding slots 222 of the sliding edge 221 of the outer shell member 21, both of alignment and assembly of the circuit board 11 and the outer shell member 21 can be completed, and the copper foil layers 12 are abutted with the sliding edge 221 to form a thermal conducting path. After second punches 224 of lugs 223 are aligned with the mounting holes 121 of the copper foil layer 12 respectively, the screws 2251 of the fixing elements 225 are penetrated through the second punches 224 and the mounting holes 121 and screwed into the nuts 2252, so that the outer shell member 21 and the circuit board 11 are locked and fastened integrally, and the overall structure is more stable. After the outer shell member 21 is combined with the circuit board 11 firmly, the copper foil layers 12 are respectively abutted with the inner sidewalls of the sliding edges 221 of the track members 22 to form the thermal conducting path and, at the same time, the second contact plate 1413 of the base plate 141 of the heat conducting module 14 is directly abutted with or the thermal medium 142 thereon is tightly and elastically attached with an inner sidewall of the accommodation open chamber 20 of the outer shell member 21 through the thermal medium 142 to form other thermal conducting path. Thereafter, the panel 13 is also combined at the front part of the circuit board 11 by above described manner of screw locking, and the panel 13 and the circuit board 11 are arranged with right angle. The ports 112 of the circuit board 11 are respectively inserted into the hollow parts 131 and exposed to the outside. In addition, other side surface of the circuit board 11 opposite to the outer shell member 21 can further be combined with other metal shell member by the manner of screw locking.

Further, the copper foil layers 12 are respectively disposed at bare copper regions 110 on two opposite side ends of the circuit board 11 of the circuit module 1, when the copper foil layer 12 on the circuit board 11 is slidably mounted along the sliding edges 221 of the outer shell member 21, the copper foil layers 12 can be easily and smoothly slid because of self-lubrication of the copper material, so as to prevent the insulation coating layer coated on the circuit board 11 from being scraped or damaged improperly to impact the original capabilities of moisture-proof, dirt-proof, dust-proof, chemical-resistance and so on. Therefore, the overall functions and effects of the heat dissipation structure 2 can be improved.

A portion of heat generated by the heat source 111 of the circuit module 1 during operation can be absorbed by the circuit board 11 or the ground layer of the circuit board 11, and then directly conducted to the copper foil layers 12 of the top and bottom side ends of the circuit board 11, and then conducted to the sliding edges 221 of the track member 22 of the heat dissipation structure 2, so as to form the thermal conducting path. The bent structure of the sliding edge 221 completely mounted on the copper foil layer 12 facilitates heat conduction. Furthermore, rest of the heat generated by the heat source 111 can be conducted to the base plate 141 of the heat conducting module 14 through the first contact plate 1411 or the thermal medium 142, and then conducted to the outer shell member 21 of the heat dissipation structure 2 through the second contact plate 1413 or other thermal medium 142, to form the thermal conducting path, increasing entire heat dissipation area through the heat dissipation structure 2, so the accumulated heat of the heat source 111 of the circuit board 11 can be conducted to the heat dissipation structure 2 for heat dissipation, and overall heat dissipation efficiency of the thermal conducting structure of the present disclosure can be improved.

Figure 7:
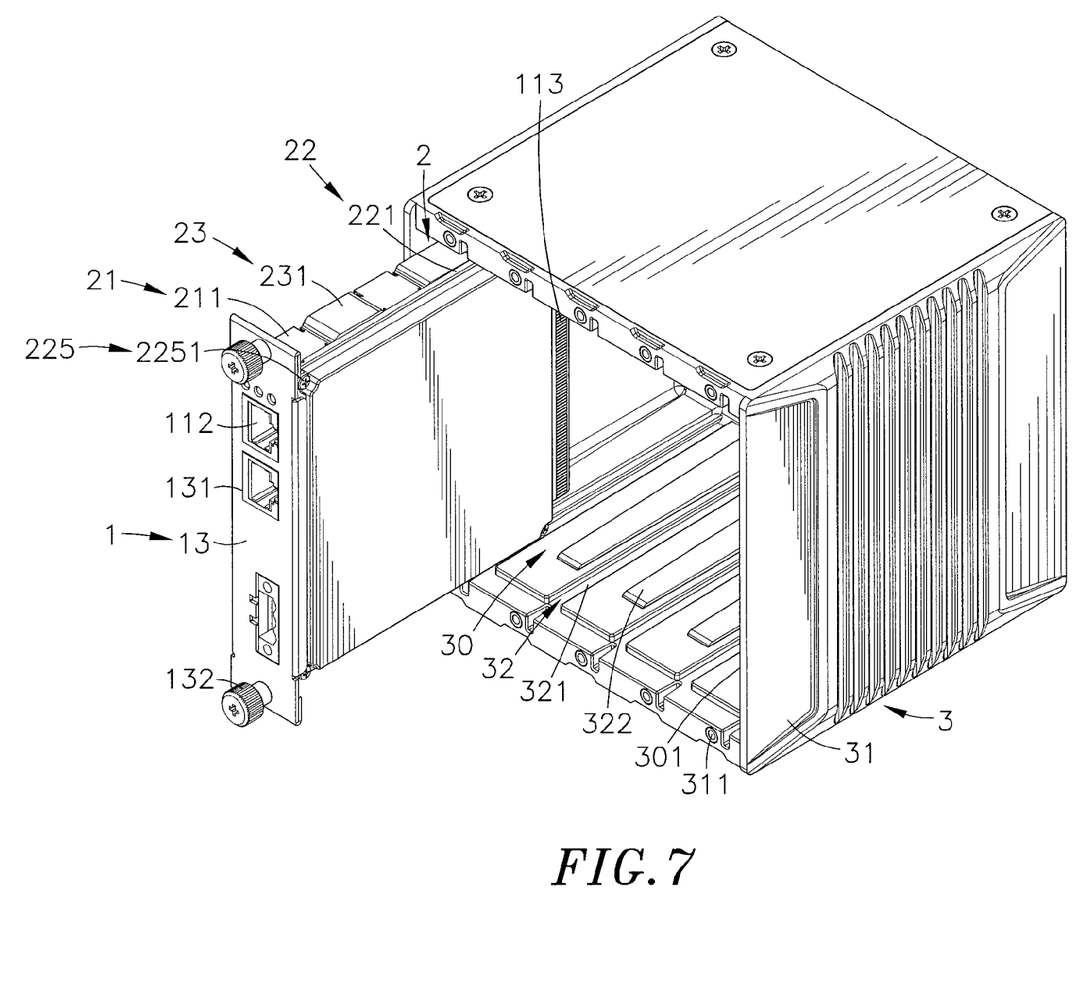
FIG. 7 is an elevational view of preferred embodiment of the present disclosure, illustrating the circuit module being inserting into a cooler bracket.
Figure 8:
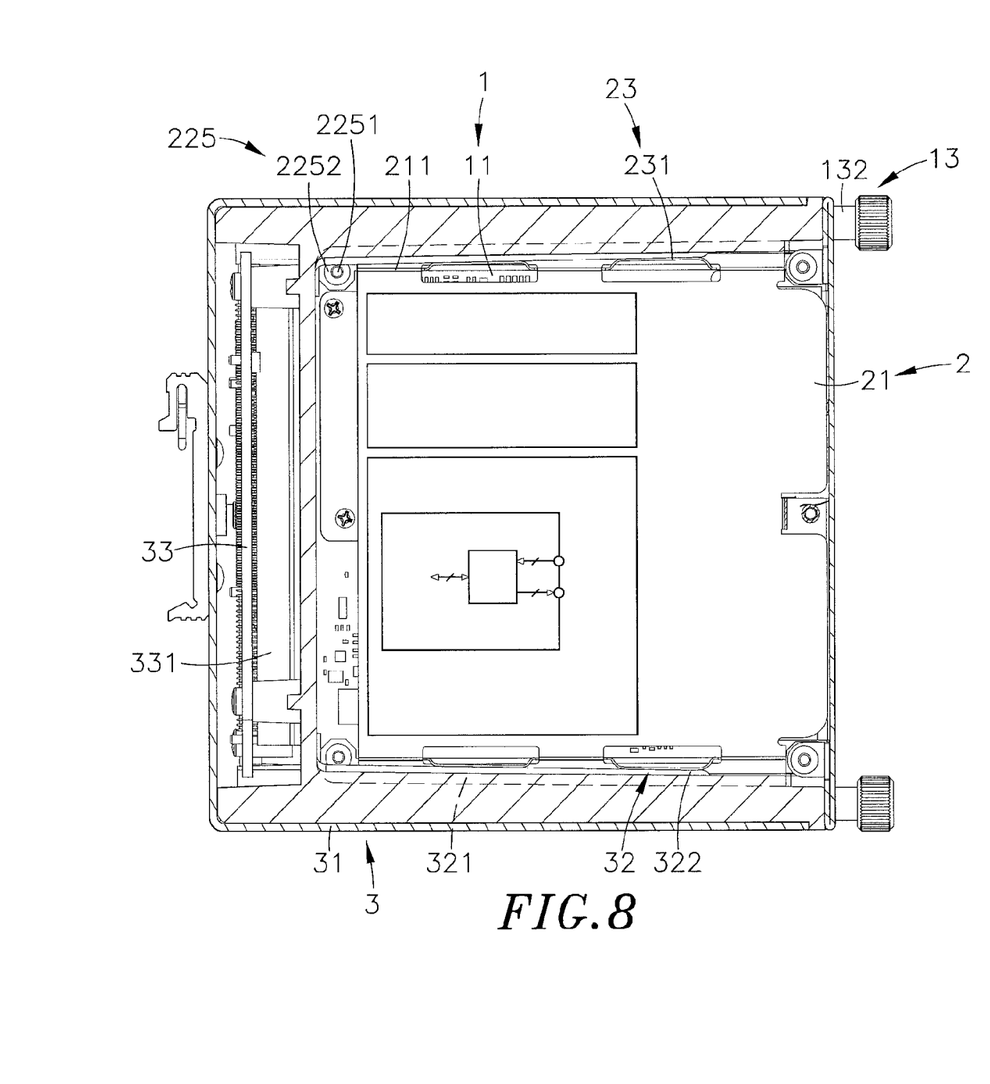
FIG. 8 is an sectional side view of preferred embodiment of the present disclosure, illustrating the circuit module of being inserted into the cooler bracket already.

Please refer to FIGS. 7 and 8 which respectively show an elevational view before the circuit module 1 is inserted into a cooler bracket 3, and a sectional view after the circuit module 1 is inserted into the cooler bracket 3 already. As shown in FIGs, the circuit module 1 of the present disclosure cooperating with the heat dissipation structure 2 can be assembled with a shell member of the network control automation system or the cooler bracket 3. The cooler bracket 3 has a main body 31 in chassis shape. The main body 31 defines a docking chamber 30 with an opening 301 at the front end thereof, and has a plurality of thread holes 311 arranged in intervals at top and bottom sides around the opening 301. The main body 31 defines a plurality of mounting part 32 which are located in intervals at top and bottom sidewall of the docking chamber 30 and backwardly extended from the opening 301 along a horizontal direction. Each of the mounting parts 32 has a track slot 321, and a protruding stop block 322 is disposed at the bottom sidewall of the docking chamber 30 between two adjacent track slots 321. A wire board 33 is disposed at the rear of the docking chamber 30 of the main body 31, and at least one connection element (such as a socket) 331 is disposed on the wire board 33.

When the circuit module 1 cooperating with the heat dissipation structure 2 are assembled into the cooler bracket 3, the sliding edges 221 of the track members 22 at top and bottom sides of the outer shell member 21 are respectively slidably mounted along the track slots 321 of the mounting part 32 corresponding thereto first, and the spring clips 231 of the elastic convex parts 23 are respectively abutted with the stop blocks 322, and the spring clip 231 generates inward elastic deformation subject to the pushing force of the stop block 322. After the outer shell member 21 is inserted into and fastened in the cooler bracket 3, an about 0.1 mm of predetermined constraint value is formed between the spring clip 231 of the elastic convex part 23 and the stop block 322; alternatively, the top surfaces of the spring clips 231 can be directly abutted with the inner sidewalls of the docking chamber 30 of the main body 31. In shaping process for the main body 31 of the cooler bracket 3, in order to separate the workpiece from the mold more easily, a certain allowance (such as a draft angle) is often reserved between the workpiece and a die parting face of the mold, so the elastic convex parts 23 abutted with the mounting part 32 of the cooler bracket 3 can form tight contacts to facilitate heat conduction. Therefore, the multiple sets of the circuit modules 1 cooperating with the heat dissipation structures 2 can be uprightly inserted into the docking chamber 30 of the cooler bracket 3 by above described assembly manner to be arranged in parallel, and the insertion part 113 of the circuit board 11 are matedly connected to the corresponding connection element 331 of the wire board 33 electrically and, in the meantime, the top and bottom sides of each of the panels 13 are abutted with the peripheral surface of the opening 301 of the main body 31, the manual screw 132 can be screwed into the thread hole 311 of the main body 31 to be fastened with the main body 31 integrally, so as to prevent the circuit module 1 and the heat dissipation structure 2 from falling out of the cooler bracket 3 to be damaged while the cooler bracket 3 is impacted by an external force.

The heat generated by the heat source 111 of the circuit module 1 in operation can be conducted to the copper foil layers 12 via the metal interlayers inside the circuit board 11, and the heat of the copper foil layers 12 is then conducted to the mounting part 32 of the cooler bracket 3 through the sliding edges 221 and the elastic convex parts 23 of the track members 22 of the heat dissipation structure 2, so as to form the thermal conducting path. Therefore, the heat dissipation structure 2 cooperating with the cooler bracket 3 can further increase entire heat dissipation area, and the accumulated heat of the heat source 111 of the circuit board 11 can be conducted to the heat dissipation structure 2 and the cooler bracket 3 for heat dissipation. According to the thermal test, the 20° C. of heat can be conducted and a nice heat dissipation effect can be provided. The amount of heat of the circuit module 1 to be conducted by the heat dissipation structure 2 cooperating with the cooler bracket 3 primarily depends on the type of material, to improve the heat dissipation efficiency for the heat source 111 and maintain normal operation of the system.

When the circuit module 1 cooperating with the heat dissipation structure 2 are assembled into the docking chamber 30 of the cooler bracket 3, the copper foil layers 12 of the circuit board 11 are respectively mounted by the bent structures of the sliding edges 221 of the track members 22, so that the structural strength of the circuit board 11 can be enhanced and the circuit module 1 can be protected from being deformed or damaged in structure thereof during the repeated plugging connection. By such a way that the sliding edge 221 of the track member 22 is in cooperation with the corresponding mounting part 32 of the cooler bracket 3 to be guided and constrained, the circuit module 1 can be assembled in the docking chamber 30 of the cooler bracket 3 stably. By means of covering the heat source 111 and other electronic components of the circuit board 11, the heat dissipation structure 2 can protect all heat sources 111 and electronic components on the circuit board 11. It is hard to limit the strength and direction of user's force during the plugging connection of the circuit module 1, so the heat dissipation structure 2 can be used to prevent multiple sets of circuit modules 1 from being damaged or broken because of being impacted with each other. Therefore, the present disclosure has nice practicability.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What the invention claimed is:

1. A thermal conducting structure applied to a network control automation system, comprising a circuit module and a heat dissipation structure, said circuit module comprising a circuit board disposed uprightly and at least one heat source disposed on a surface of said circuit board, and said circuit board defining bare copper regions disposed at top and bottom side ends thereof, and copper foil layers respectively disposed on said bare copper regions on left and right side surfaces of an end of said circuit board in a horizontal direction and configured for conducting a heat generated during operation of said at least one heat source, wherein the circuit board comprises a plurality of ports at a front part thereof, and an insertion part disposed along a vertical direction at a rear end thereof; said heat dissipation structure comprising an outer shell member which has opposite side panels respectively disposed at top and bottom lateral sides thereof, and each of said side panels defining a track member which has a sliding edge and a sliding slot formed inside said sliding edge in the horizontal direction to mount and abut with said copper foil layer for completing assembly of said heat dissipation structure and said circuit module, and forming thermal conducting path, wherein an accommodation open chamber through front-to-rear is formed between said outer shell member and said two side panels thereof, so that said circuit board is horizontally movable to be positioned inside said accommodation open chamber; wherein said circuit board of said circuit module comprises a plurality of fastening parts located thereon and around said heat source, and said fastening parts are combined with a heat conducting module which comprises a base plate configured to respectively contact said heat source and said outer shell member of said heat dissipation structure for forming thermal conducting paths; and wherein a side end of said base plate of said heat conducting module is bent and extended towards said circuit board to form at least one smooth-shaped first contact plate which is misaligned in parallel with said base plate and used to abut with a surface of said heat source, and a lower end of said first contact plate is then bent and outwardly extended over said base plate to other side surface of the base plate to form a bent part, and said bent part is then bent and reversely extended in parallel with said first contact plate to form a smooth-shaped second contact plate which is used to abut with an inner wall of said outer shell member of said heat dissipation structure.

2. The thermal conducting structure as claimed in claim 1, wherein said at least one heat source is disposed on a left side surface, a right side surface or left and right side surfaces of said circuit board of said circuit module, and said heat generated during operation of said at least one heat source of said circuit module is conducted to said copper foil layers via said circuit board to form a thermal conducting path.

3. The thermal conducting structure as claimed in claim 2, wherein said circuit board of said circuit module comprises a panel disposed at a front part thereof, said panel defines a plurality of hollow parts cut therethrough to mount and expose a plurality of ports, and said at least one heat source in cooperation with said ports and said insertion part form a network interface card matching with Ethernet-network-based fieldbus technology.

4. The thermal conducting structure as claimed in claim 3, wherein said at least one heat source is a FPGA chip.

5. The thermal conducting structure as claimed in claim 2, wherein said at least one heat source is a FPGA chip, a CPU, a chip set or an image processor.

6. The thermal conducting structure as claimed in claim 1, wherein each of said fastening parts of said circuit board has a bolt, and said base plate of said heat conducting module defines a plurality of first punches cut therethrough and corresponding to said fastening parts, and positioning elements are respectively inserted into said first punches for screwing into said bolts, so as to combine said circuit board and said heat conducting module integrally.

7. The thermal conducting structure as claimed in claim 1, wherein a thermal medium is disposed on said first contact plate of said base plate of said heat conducting module and configured to elastically attach to a surface of said heat source.

8. The thermal conducting structure as claimed in claim 1, wherein a thermal medium is disposed on said second contact plate of said base plate of said heat conducting module and configured to elastically attach to said outer shell member of said heat dissipation structure.

9. The thermal conducting structure as claimed in claim 1, wherein each of said two track members of said heat dissipation structure comprises two sliding edges which are formed by being outwardly extended first and then bent inwardly, and each of said sliding edges defines said sliding slot extended along a horizontal direction, and said copper foil layers of said circuit module are slidably mounted into and abutted with said sliding slot.

10. The thermal conducting structure as claimed in claim 9, wherein said copper foil layers of said circuit module define a plurality of mounting holes cut therethrough and respectively located at corners of said circuit board, each of said sliding edges of said track members of said heat dissipation structure defines lugs located at said openings of front and rear ends of said sliding slot respectively and outwardly extended, each of said lugs has a second punch, and fixing elements are respectively penetrated through said mounting holes of said circuit board and said second punches respectively, so as to combine said outer shell member and said circuit board integrally.

* * * * *